United States Patent [19]
Lim

[11] Patent Number: 5,985,711
[45] Date of Patent: Nov. 16, 1999

[54] METHOD OF FABRICATING SEMICONDUCTOR DEVICE

[75] Inventor: Jun Hee Lim, Seoul, Rep. of Korea

[73] Assignee: LG Semicon Co., Ltd., Chungcheongbuk-do, Rep. of Korea

[21] Appl. No.: 08/829,469

[22] Filed: Apr. 17, 1997

[30] Foreign Application Priority Data

Jul. 19, 1996 [KR] Rep. of Korea .................. 96-29219

[51] Int. Cl.$^6$ ............................................. H01L 21/8238
[52] U.S. Cl. ........................... 438/229; 438/233; 438/163
[58] Field of Search .................. 438/253–256, 438/396–399, 279, 229, 233, 163

[56] References Cited

U.S. PATENT DOCUMENTS 5,384,287 1/1995 Fukase ..................................... 437/228

*Primary Examiner*—Jey Tsai
*Attorney, Agent, or Firm*—Morgan, Lewis & Bockius LLP

[57] ABSTRACT

A method of fabricating a semiconductor device includes the steps of forming a plurality of gate electrodes on a first region and a second region of a substrate, the plurality of gate electrodes having cap insulating layers thereon; forming source and drain regions in the first region and the second region, the source and drain regions of the second region having an LDD structure; forming an insulating layer on the substrate including the plurality of gate electrodes; forming contact holes in the insulating layer to simultaneously expose the source and the drain regions of the first region and the cap insulating layer on the gate electrodes in the second region; selectively removing the cap insulating layer on the gate electrodes in the second region; and forming a metal line in the contact holes and on the insulating layer.

19 Claims, 5 Drawing Sheets cell region | periphery region cell region    periphery region cell region | periphery region

METHOD OF FABRICATING SEMICONDUCTOR DEVICE

This application claims the benefit of Korean Application No. 96-29219, filed Jul. 19, 1996, which is hereby incorporated by reference.

BACKGROUND OF THE INVENTION

1. Field of the Invention

The present invention relates to a method of fabricating a semiconductor device and, more particularly, to a method of fabricating a highly integrated semiconductor device with improved reliability.

2. Discussion of the Related Art

Generally, as the packing density of an integrated circuit increases, the device size decreases and its metal line becomes finer and multilevel. Accordingly, the step coverage on a contact hole, a via hole or an uneven surface of the device becomes more important. To solve this problem in a dynamic random access memory (DRAM), a self aligned contact hole was proposed. This contact hole is formed in such a manner that double insulating layers are formed, and its lower insulating layer is not etched when a hole is formed in its upper insulating layer.

The conventional method of fabricating a semiconductor device employing the self aligned contact hole is disclosed in U.S. Pat. No. 5,384,287 and will be explained below with reference to FIGS. 1A to 1G. As shown in FIG. 1A, on a semiconductor substrate 1 including a cell region and a periphery region, a field oxide layer 2 for isolating devices from each other is formed on a field region of the semiconductor substrate 1. An active region is defined by the field oxide layer 2, i.e., where the field oxide layer 2 is not formed. Thereafter, a first insulating layer 3, a polysilicon layer 4 and a second insulating layer 5 are sequentially formed on the overall surface of the substrate 1.

Referring to FIG. 1B, a first photoresist layer (not shown) is formed on the second insulating layer 5, and selectively exposed and developed to form a first photoresist pattern (not shown). Then, the second insulating layer 5, the polysilicon layer 4 and the first insulating layer 3 are selectively removed using the first photoresist pattern as a mask, to thereby form gate electrodes. Here, the first insulating layer 3 is used as a gate insulating layer, and the second insulating layer is used as a cap gate insulating layer. The second insulating layer may be formed of nitride. Thereafter, impurity ions are implanted in a lower concentration into the substrate 1 using the gate electrodes as a mask, to thereby form a lightly doped impurity region. A third insulating layer is formed on the substrate 1 including the gate electrodes and etched back, to thereby form gate sidewalls 6 on both sides of the gate electrodes. Then, impurity ions are implanted in a higher concentration into the substrate 1 using the gate electrodes, the sidewalls 6 and a second photoresist pattern (not shown) which selectively masks the cell region as a mask, to thereby form source and drain impurity regions 7 having a lightly doped drain (LDD) structure only on the periphery region. The second and third insulating layers are to serve as a lower insulating layer when a self aligned contact hole is formed in the following process.

Referring to FIG. 1C, a fourth insulating layer 9 is formed on the overall surface of the substrate, and a third photoresist layer is formed thereon. Here, the fourth insulating layer 9 serving as an interlevel insulating layer may be formed of an oxide.

Referring to FIG. 1D, the third photoresist layer is selectively exposed and developed to thereby form a third photoresist pattern 10 defining a contact hole region. This contact hole region is defined only in the periphery region.

Referring to FIG. 1E, the fourth insulating layer 9 and the second insulating layer 5 are selectively etched using the third photoresist pattern 10 as a mask. By doing so, contact holes 11 and 11a are formed to respectively expose a predetermined portion of the substrate 1, and the surface of the gate electrodes.

Here, the actual areas of the contact holes formed through the etching of the fourth insulating layer 9 are smaller than the areas defined by the third photoresist pattern 10. This is because the sidewall 6 formed on the side of the gate electrode reduces the area of the contact hole.

Referring to FIG. 1F, a fourth photoresist layer 10a is formed on the overall surface of the substrate 1 including the fourth insulating layer 9, and only a portion of the fourth photoresist layer 10a placed on the cell region is selectively exposed and developed, thereby forming a fourth photoresist pattern 10a.

Referring to FIG. 1G, the fourth insulating layer 9 is selectively etched using the fourth photoresist pattern 10a as a mask, to thereby expose a predetermined portion of the substrate. By doing so, contact holes are formed. Thereafter, a metal layer is formed on the overall surface of the substrate including the contact holes and selectively etched through photolithography, to thereby form a metal line 12.

The aforementioned conventional method of fabricating a semiconductor device has the following problems. First, the surface of the substrate in the periphery region is overetched when the cap gate insulating layer, i.e., the second insulating layer, is etched because the cap gate insulating layer and the interlevel insulating layer (i.e., the fourth insulating layer) have etch selectivity to each other. This leads to poor quality of the contact hole pattern on the source and drain regions. As a result, the characteristic of the device is deteriorated. In addition, since the contact holes in the periphery region and the cell region are patterned using separate photoresist patterns, it is difficult to have accurate alignment.

SUMMARY OF THE INVENTION

Accordingly, the present invention is directed to a method of fabricating a semiconductor device that substantially obviates one or more of the problems due to limitations and disadvantages of the related art.

An object of the present invention is to provide a method of fabricating a semiconductor device which prevents a substrate from being damaged during an etching process, thereby improving characteristics of a highly integrated semiconductor device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of fabricating a semiconductor device includes the steps of: forming a plurality of gate electrodes on first and second regions of a substrate, the height of the first and second regions being different from each other, the gate having a cap insulating layer thereon; implanting an impurity in a lower concentration into the substrate using the gate electrode as a mask, and forming sidewalls on both sides of the gate electrode; implanting an impurity in a higher concentration only into the second region of the substrate, to thereby form source and drain regions; forming an insulating layer on the overall surface of the substrate, forming a first mask pattern on the insulating layer, and forming a contact hole using the first mask pattern in order to simultaneously expose the source and drain regions of the first region, and the cap insulating layer placed on the gate electrodes formed on the second region; removing the first mask pattern, forming a second mask pattern on the insulating layer, and exposing the surface of the gate electrode formed on the first region using the second mask pattern; and forming a metal layer on the overall surface of the substrate, and patterning the metal layer to form a metal line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
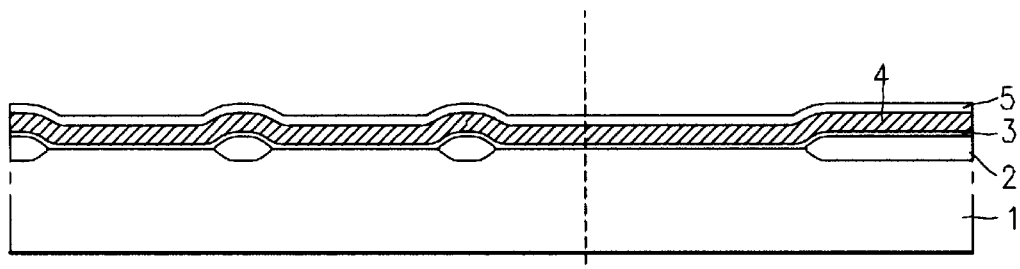
FIGS. 1A to 1G are cross-sectional views showing a conventional method of fabricating a semiconductor device.
Figure 1B:
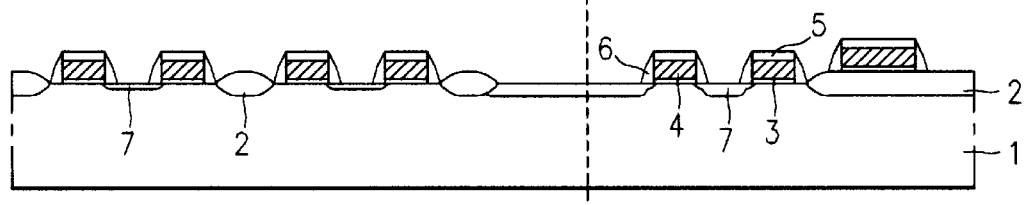
Figure 1C:
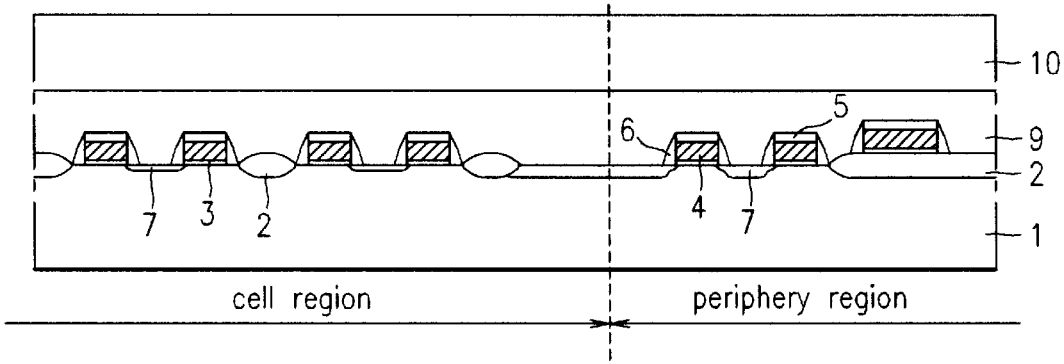
Figure 1D:
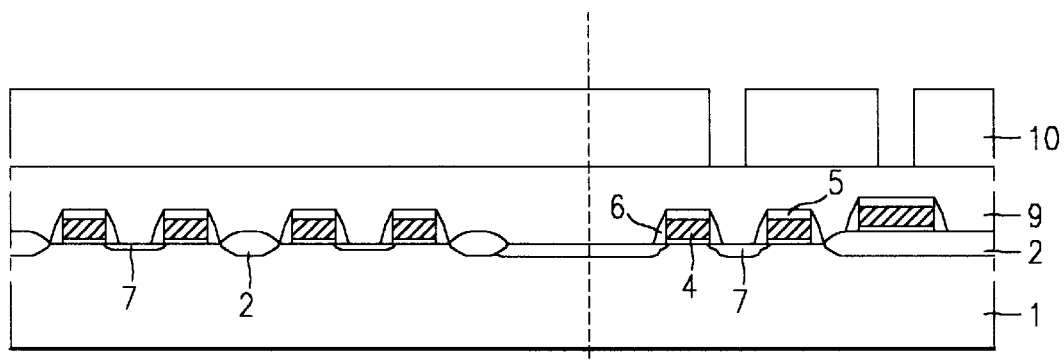
Figure 1E:
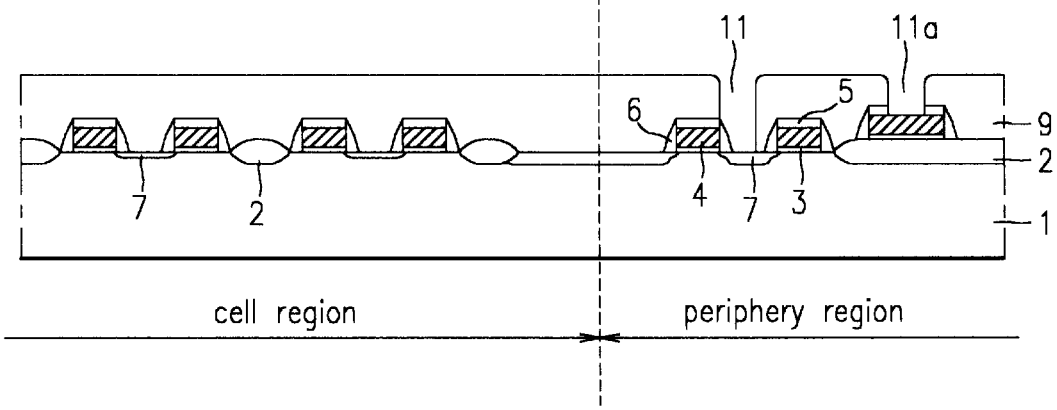
Figure 1F:
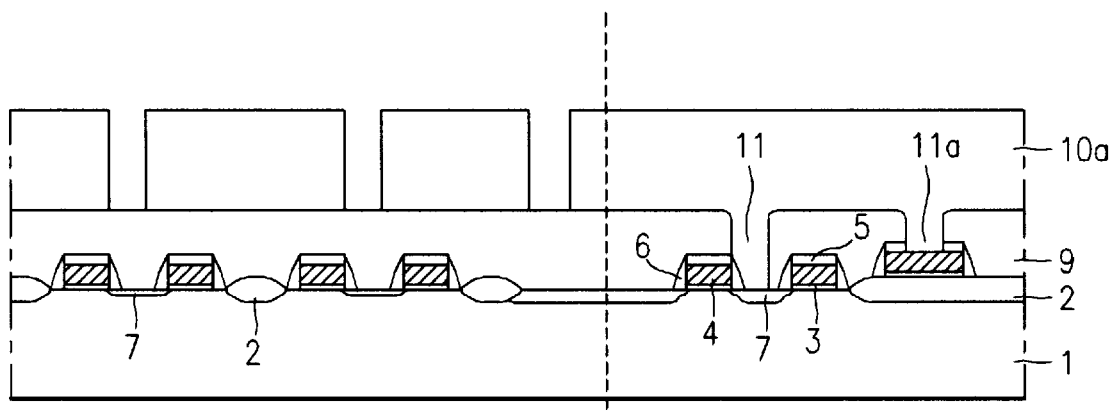
Figure 1G:
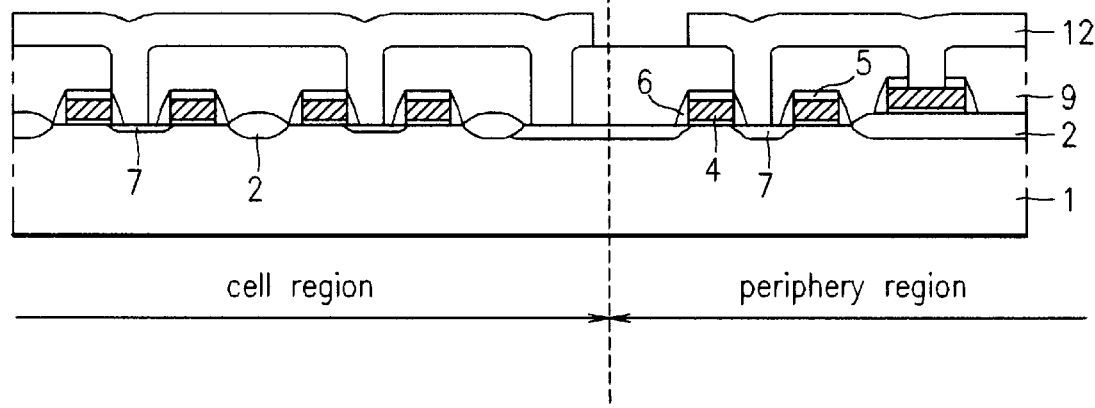
Figure 2A:
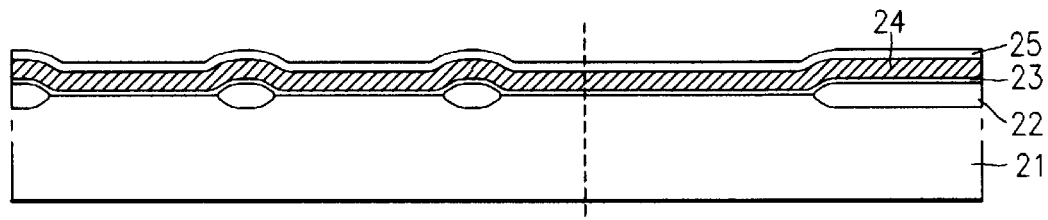
FIGS. 2A to 2G are cross-sectional views showing a method of fabricating a semiconductor device according to the present invention.

FIGS. 2A to 2G are cross-sectional views showing a method of fabricating a semiconductor device according to the present invention. Referring to FIG. 2A, on a semiconductor substrate 21 including a cell region and a periphery region, a field oxide layer 22 is formed on a field region of the semiconductor substrate 21. An active region is defined by the field oxide layer 22, i.e., where the field oxide layer 22 is not formed. Thereafter, a first insulating layer 23, a polysilicon layer 24 and a second insulating layer 25 are sequentially formed on the overall surface of the substrate 21. Here, the second insulating layer 25 is used as a cap gate insulating layer, and may be formed from a nitride layer.

Figure 2B:
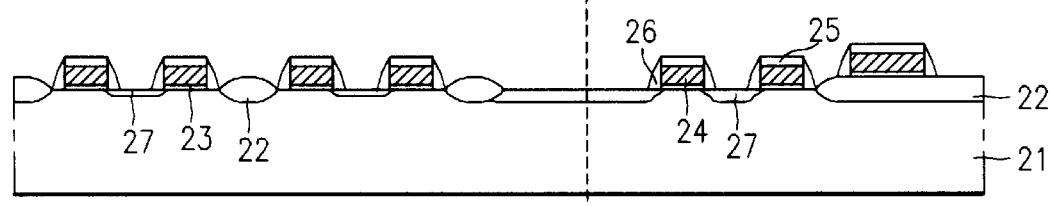

Referring to FIG. 2B, a first photoresist layer (not shown) is formed on the second insulating layer 25, and selectively exposed and developed to form a first photoresist pattern (not shown). Then, the second insulating layer 25, the polysilicon layer 24 and the first insulating layer 23 are selectively removed using the first photoresist pattern as a mask, to thereby form gate electrodes having cap gate insulating layers thereon in the cell region and the periphery region. Here, the gate electrodes respectively formed in the cell region and the periphery region have different heights from each other due to the field oxide layer 22.

Thereafter, impurity ions are implanted in a lower concentration into the substrate 21 using the gate electrodes as a mask, to form a lightly doped impurity region.

Successively, a third insulating layer is formed on the substrate 21 including the gate electrodes and etched back, to thereby form gate sidewalls 26 on both sides of the gate electrodes. Then, impurity ions are implanted in a higher concentration into the substrate 21 using the gate electrodes, the sidewalls 26 and a second photoresist pattern (not shown) which selectively masks the cell region as a mask, to thereby form source and drain impurity regions 27 having LDD structure only on the periphery region.

Figure 2C:
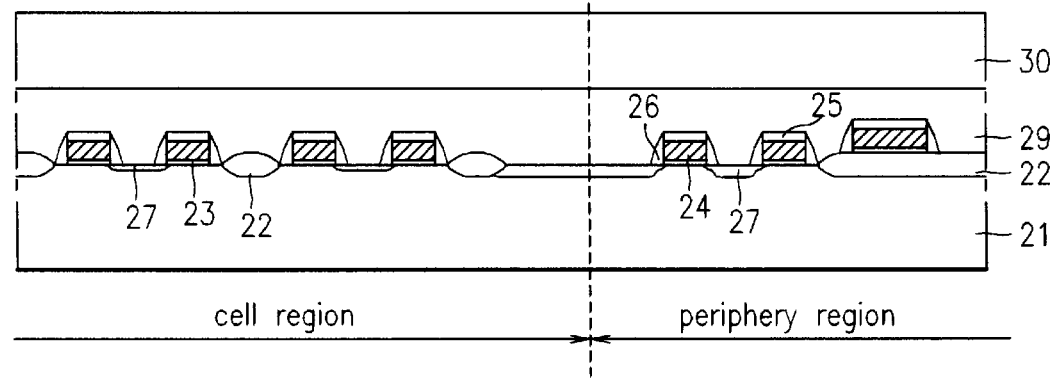

Referring to FIG. 2C, a fourth insulating layer 29 is formed on the overall surface of the substrate, and a third photoresist layer is formed thereon. Here, the fourth insulating layer 29 and the second insulating layer 25 have etch selectivity with respect to each other.

Figure 2D:
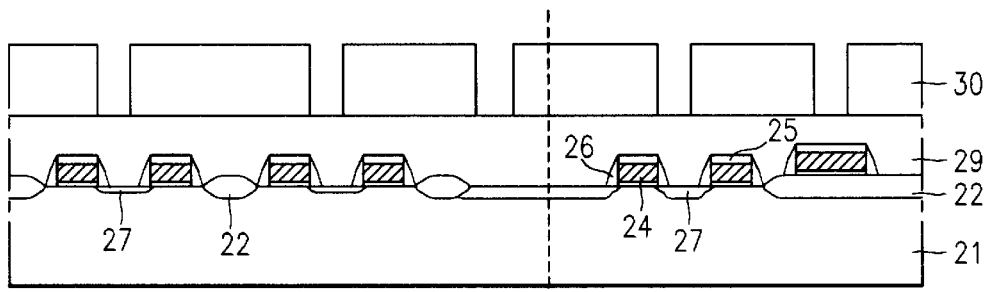
Figure 2E:
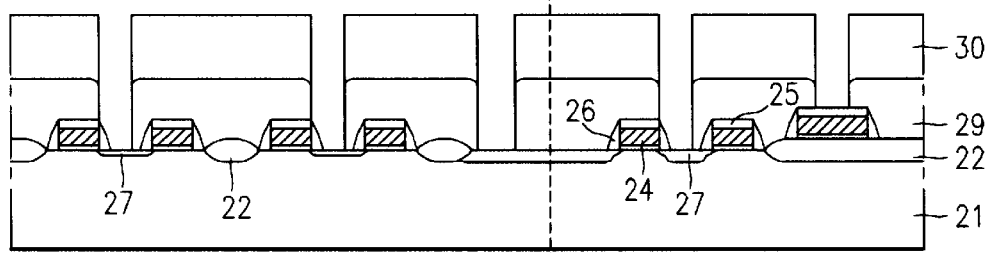

Referring to FIG. 2D, the third photoresist layer is selectively exposed and developed, to thereby form a third photoresist pattern 30. Referring to FIG. 2E, the fourth insulating layer 29 is selectively etched using the third photoresist pattern 30 as a mask. By doing so, contact holes are formed to expose the source and drain impurity regions 27, and the second insulating layer 25 (i.e., the cap gate insulating layer) formed on the gate electrode located above the field oxide layer 22 of the periphery region.

Figure 2F:
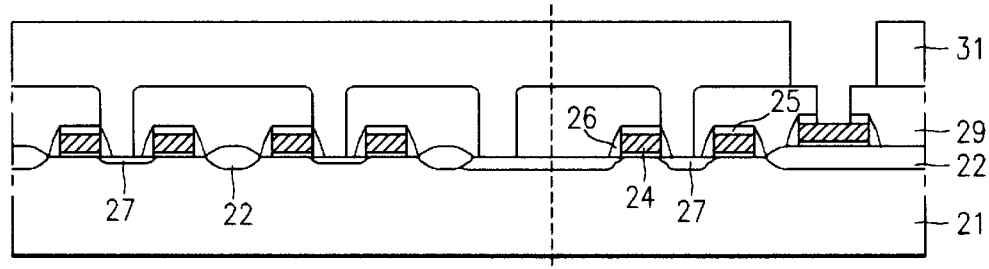

Referring to FIG. 2F, the third photoresist pattern 30 is removed, and then a fourth photoresist pattern 31 is formed on the overall surface of the substrate 21 including the fourth insulating layer 29. Thereafter, the second insulating layer 25 (the cap gate insulating layer) is selectively removed using the fourth photoresist pattern 31 as a mask, to thereby expose the surface of the gate electrode placed on the field oxide layer 22 of the periphery region.

Figure 2G:
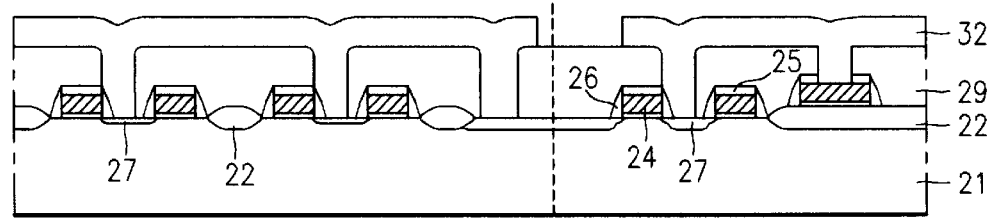

Referring to FIG. 2G, after removing the fourth photoresist pattern 31, a metal layer is formed on the overall surface of the substrate including the contact holes and selectively removed, to thereby form a metal line 32. By doing so, the semiconductor device of the present invention is completed.

According to the present invention, the substrate is prevented form being overetched during the contact hole formation process. This improves the characteristic of the device. Furthermore, since the contact holes of the periphery region and the cell region are patterned using the same photoresist layer, it is possible to perform alignment accurately.

It will be apparent to those skilled in the art that various modifications and variations can be made in the method of fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device comprising the steps of:

forming a plurality of gate electrodes with cap insulating layers thereon, on a first region and a second region of a substrate, a height of the first region being different from a height of the second region;

implanting a first impurity in a lower concentration into the substrate using the plurality of gate electrodes as a mask;

forming sidewalls on sides of the plurality of gate electrodes;

implanting a second impurity in a higher concentration into the first region of the substrate, to thereby form source and drain regions;

forming an insulating layer on the substrate including the plurality of gate electrodes;

forming a first mask pattern on the insulating layer;

forming contact holes in the insulating layer using the first mask pattern to simultaneously expose the source and drain regions of the first region and the cap insulating layer on the gate electrodes formed in the second region;

removing the first mask pattern;

forming a second mask pattern on the insulating layer;

selectively removing the cap insulating layer to expose the gate electrodes in the second region by using the second mask pattern as a mask; and forming a metal layer on an overall surface of the substrate and patterning the metal layer to form a metal line.

2. The method as claimed in claim 1, wherein the cap insulating layer and the insulating layer have etch selectivity to each other.

3. The method as claimed in claim 1, wherein the substrate has a first conductivity type and the source and drain regions have a second conductivity type.

4. The method as claimed in claim 3, wherein the first conductivity type is p-type, and the second conductivity type is n-type.

5. The method as claimed in claim 1, wherein the first region is a cell region and the second region is a periphery circuit region.

6. The method as claimed in claim 1, wherein the source and drain regions of the second region have an LDD structure.

7. The method as claimed in claim 1, wherein the cap insulating layer includes a nitride layer.

8. A method of fabricating a semiconductor device comprising the steps of:

forming a plurality of gate electrodes on a substrate having a first region and a second region, the plurality of gate electrodes each having a cap insulating layer thereon;

forming source and drain regions in the first region and the second region, the source and drain regions of the second region having an LDD structure;

forming a first insulating layer on the substrate including the plurality of gate electrodes;

forming contact holes in the first insulating layer to simultaneously expose the source and the drain regions of the first region, and the cap insulating layer on the gate electrodes in the second region;

forming a photoresist mask pattern on the first insulation layer;

selectively removing the cap insulating layer to expose the gate electrodes in the second region by using the photoresist mask pattern as a mask; and forming a metal line in the contact holes and on the first insulating layer.

9. The method as claimed in claim 8, wherein the cap insulating layer and the first insulating layer have etch selectivity to each other.

10. The method as claimed in claim 8, wherein the substrate has a first conductivity type and the source and drain regions have a second conductivity type.

11. The method as claimed in claim 10, wherein the first conductivity type is p-type, and the second conductivity type is n-type.

12. The method as claimed in claim 8, wherein the first region is a cell region and the second region is a periphery circuit region.

13. The method as claimed in claim 8, wherein the cap insulating layer includes a nitride layer.

14. The method as claimed in claim 8, wherein the step of forming the plurality of gate electrodes includes the steps of:

forming a second insulating layer on the substrate;

forming a polysilicon layer on the second insulating layer;

forming a third insulating layer on the polysilicon layer;

forming a photoresist pattern on the third insulating layer; and selectively removing the third insulating layer, the polysilicon layer, and the second insulating layer using the photoresist pattern as a mask, to thereby form the plurality of gate electrodes with the third insulating layer becoming the cap insulating layer.

15. The method as claimed in claim 8, wherein the step of forming the source and drain regions includes the steps of:

implanting a first impurity in a lower concentration into the substrate using the plurality of gate electrodes as a mask;

forming sidewalls on sides of the plurality of gate electrodes; and implanting a second impurity in a higher concentration into the first region of the substrate.

16. The method as claimed in claim 15, wherein the step of forming the sidewalls includes the steps of:

forming a second insulating layer on the substrate including the plurality of gate electrodes; and etching back the second insulating layer to thereby form sidewalls on the sides of the plurality of gate electrodes.

17. The method as claimed in claim 8, wherein a height of the first region and a height of the second region are different.

18. The method as claimed in claim 8, wherein the step of forming contact holes in the first insulating layer includes the steps of:

forming a photoresist pattern on the first insulating layer; and selectively etching the first insulating layer using the photoresist pattern as a mask to form contact holes.

19. The method as claimed in claim 8, wherein the step of forming the metal line includes the steps of:

forming a metal layer on the first insulating layer and in the contact holes; and patterning the metal layer to form the metal line.

* * * * *